(12) United States Patent
Szu et al.

(10) Patent No.: US 7,059,885 B2
(45) Date of Patent: Jun. 13, 2006

(54) LAND GRID ARRAY CONNECTOR WITH HORIZONTAL STOP

(75) Inventors: Ming-Lun Szu, Tu-Chen (TW); Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/993,867

(22) Filed: Nov. 19, 2004

(65) Prior Publication Data

US 2005/0112929 A1   May 26, 2005

(30) Foreign Application Priority Data

Nov. 21, 2003   (TW) .............................. 92220586 U

(51) Int. Cl.
 *H01R 13/62* (2006.01)
(52) U.S. Cl. .................................................... 439/331
(58) Field of Classification Search ................ 439/331, 439/41, 342, 135, 73
 See application file for complete search history.

(56) References Cited

U.S. PATENT DOCUMENTS 6,932,622 B1 *  8/2005  Liao et al. ..................... 439/73
6,939,140 B1 *  9/2005  Liao ............................. 439/41

* cited by examiner

*Primary Examiner*—Chandrika Prasad
(74) *Attorney, Agent, or Firm*—Wei Te Chung

(57) ABSTRACT

An LGA connector includes an insulative base (2) mounted on a printed circuit board, a stiffener (3) defined around the base, a metal clip (4) pivotably engaged on the stiffener, and a lever (5) for fastening the clip onto the base. The clip includes a main plate (41) and a plurality of arched clasps (42), and the stiffener includes corresponding number of slots (321) in a side wall (32) for engaging with the clasps. The arched clasp defines a plurality of protrusions (422) for preventing the clip from moving horizontally.

16 Claims, 5 Drawing Sheets

LAND GRID ARRAY CONNECTOR WITH HORIZONTAL STOP

BACKGROUND OF THE INVENTION

1. Field of the Invention

The present invention relates to an electrical connector for electrically connecting an electronic package such as an integrated circuit (IC) chip with a circuit substrate such as a printed circuit board (PCB), and particularly to a land grid array connector adapted for receiving a land grid package (LGP) therein and electrically connecting the LGP with a PCB.

2. Description of the Prior Art

Land grid array (LGA) connector for connecting a Land Grid Package (LGP) with a printed circuit board (PCB) is widely used in the field of electrical connectors. The LGP typically comprises a plurality of pads in a lower surface thereof for connecting with corresponding contacts of the connector, and the LGP is disposed in proper predetermined position. Because of the high density of the contacts, any position missing of the LGP and the connector will increase the stability of the connector.

Referring to FIGS. 4–5, a conventional Land Grid Array (LGA) connector is illustrated. The LGA connector 6 comprises an insulative base 61 mounted on a printed circuit board (not shown), a stiffener 62 defined around the base 61, a metal clip 63 pivotably engaged on one end of the stiffener 62, and a lever 64 engaged on an opposite end of the stiffener 62 for fastening the clip 63 onto the base 61. The base 61 defines a multiplicity of terminal passageways (not labeled) in matrix array, for interferentially receiving a number of electrical contacts (not labeled) therein.

The clip 63 is substantially rectangular. A pair of arched clasps 631 extends from one end of the clip 63 for pivotably engaging with the stiffener 62, and the opposite end defines an extending portion 632 for engaging with the lever 64. The extending portion 632 comprises a transition portion 6321 and a pressed portion 6322 connecting with the transition portion 6321. The transition portion 6321 extends slantly towards the base 61, and the pressed portion 6322 is substantially parallel to the base 61.

The stiffener 62 comprises a bottom surface 621 and a plurality of side walls 622 extending upwardly from the bottom surface 621. One of the side walls 622 defines a pair of slots 623 for engaging with the arched clasps 631 of the clip 63. The lever 64 comprises an operation portion 641 and an axis portion 642, and the axis portion 642 comprises a pressing portion 6422 in the middle thereof for pressing the pressed portion 6322 of the clip 63.

In use, the clip 63 is first rotated to a vertical open position, and the LGP 7 is seated onto a predetermined position of the base 61. Then the clip 63 is rotated to a horizontal close position. When the clip 63 is fittingly attached on LGP 7, the operation portion 641 of the lever 64 is actuated, and the pressing portion 6422 presses the transition portion 6321. The operation portion 641 is continuously rotated, the pressing portion 6422 moves from the slant pressed portion 6321 to the pressed portion 6322. During rotating, the pressing portion 6422 pushes the clip 63 to move towards the side wall 622 that defines the slots 623. The moving clip 63 will inevitably drive the LGP simultaneity, for the friction therebetween. Therefore, the LGP will move relative to the base 61 and the contacts that connect with the pads of the LGP 7.

However, one problem with this type of LGA connector is that the moved LGP will be away from its predetermined position, and the connecting between the pads of the LGP and the contacts is prone to miss. Therefore, the reliability of the mechanical and electrical performance is decreased.

In view of the above, a new LGA connector which overcomes the above-mentioned disadvantages is desired.

SUMMARY OF THE INVENTION

Accordingly, an object of the present invention is to provide an LGA connector that can prevent the clip and the LGP from moving horizontally, therefore ensuring reliability connecting performance of the LGA connector.

To achieve the above-mentioned object, an LGA connector in accordance with a first embodiment of the present invention comprises an insulative base mounted on a printed circuit board, a stiffener defined around the base, a metal clip pivotably engaged on the stiffener, and a lever for fastening the &lip onto the base. The clip comprises a main plate and a plurality of arched clasps. The stiffener comprises corresponding number of slots in a side wall for engaging with the clasps. The arched clasp defines a plurality of protrusions for preventing the clip from moving in horizontal.

Other objects, advantages and novel features of the invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
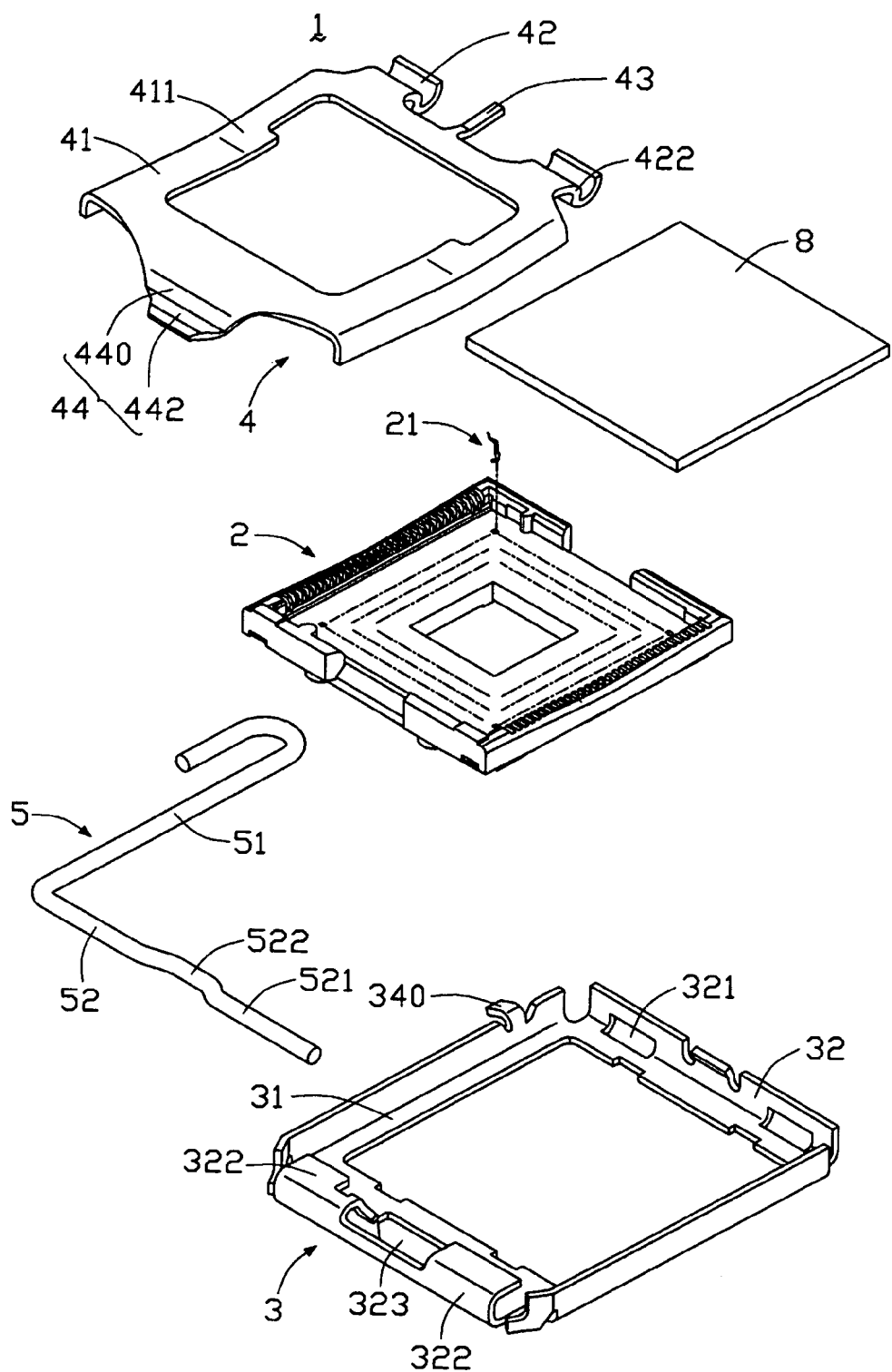
FIG. 1 is an exploded, isometric view of a land grid array connector in accordance with the first embodiment of the present invention, together with a land gird package ready to be mounted onto a base of the connector.
Figure 2:
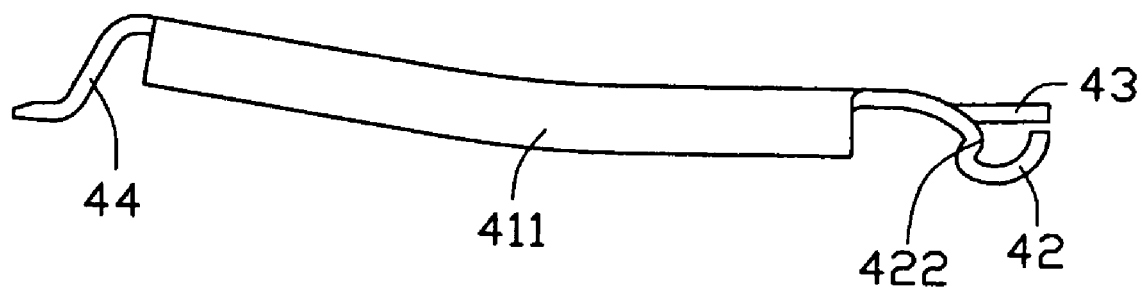
FIG. 2 is a side plan view of a clip of the land grid array connector of FIG. 1.

Referring to FIGS. 1–2, a land grid array connector 1 in accordance with the first embodiment of the present invention comprises an insulative base 2 mounted on a printed circuit board (not shown), a stiffener 3 defined around the base 2, a metal clip 4 pivotably engaged on one end of the stiffener 3, and a lever 5 engaged on an opposite end of the stiffener 3 for fastening the clip 4 onto the base 2. A Land Grid Package (LGP) 8 is ready to be disposed between the base 2 and the clip 4, for connecting with the printed circuit board via the connector 1.

The base 2 is substantially rectangular. A plurality of passageways (not labeled) is defined in the base 2 for receiving a corresponding number of electrical contacts 21 therein. The stiffener 3 comprises a bottom wall 31 and four side walls 32 extending upwardly from the bottom wall 31.

The bottom wall 31 and side walls 32 cooperatively define a receiving room for accommodating the base 2. One side wall 32 defines a pair of slots 321, and the opposite side wall 32 define a pair of mounting portion 322 at two ends thereof. A recess 323 is defined between the two mounting portion 322. In one of the other two side walls 32, a hook 340 extends outward.

The clip 4 comprises a substantially rectangular main plate 41 with a middle window, a pair of arched clasps 42 extending from one side of the main plate 41, a anti-rotation bar 43 and a extending portion 44 extending from the opposite side of the main plate 41. The extending portion 44 comprises a slant transition portion 440 connecting with the main plate 41 and a pressed portion 442. A pair of engaging portion 411 bends toward the base 2 in a middle of the main plate 41 for pressing the LGP 8. The width of the arched clasp 42 is slightly less than the width of the slot 321, and the clasp 42 is pivotably mounted in the slots 321. The clasp 42 is U-shaped configuration, and it comprises a first side surface and an opposite second surface. The first side surface connects with the main plate 41 and defines a punched protrusion 422, the protrusion 422 protrudes into the U-shaped space between the two opposite side surface.

The lever 5 comprises a operation portion 51 and an axis portion 52 perpendicular to the operation portion 51. The axis portion 52 defines a pair of support portion 521 for being restricted in the mounting portion 322 of the stiffener 3 and a middle pressing portion 522. The pressing portion 522 can rotate in the recess 323 of the stiffener 3 for pressing the extending portion 44.

Figure 3:
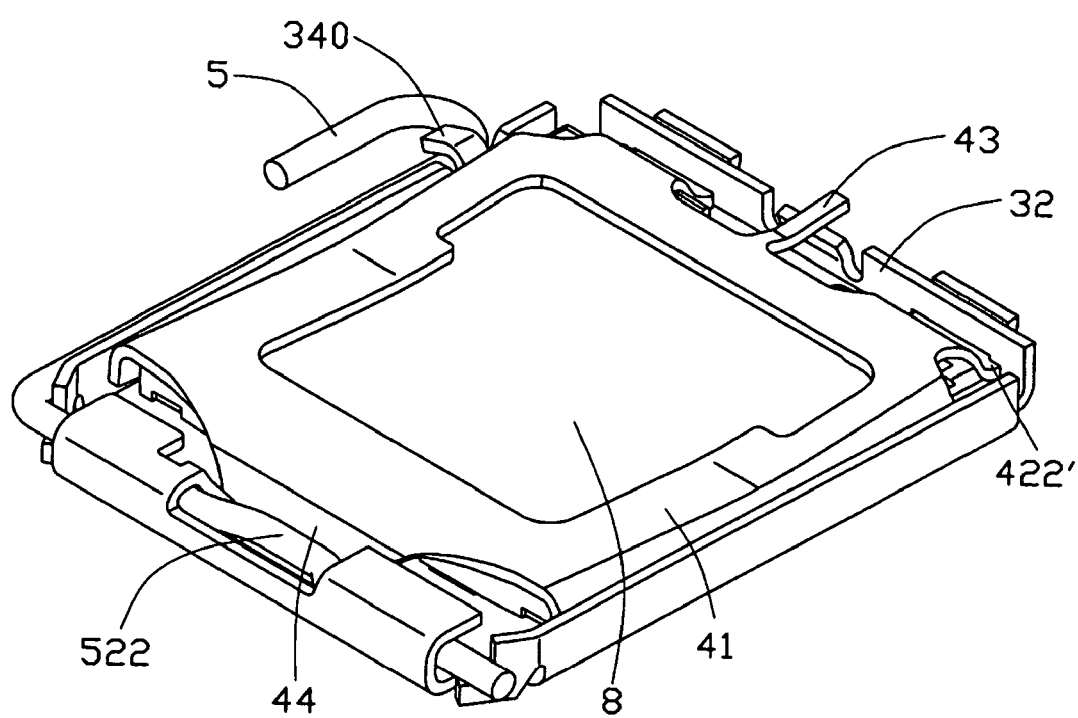
FIG. 3 is an isometric view of a land grid array connector in accordance with a second embodiment of the present invention, together with a land grid package mounted onto a base of the connector.
Figure 4:
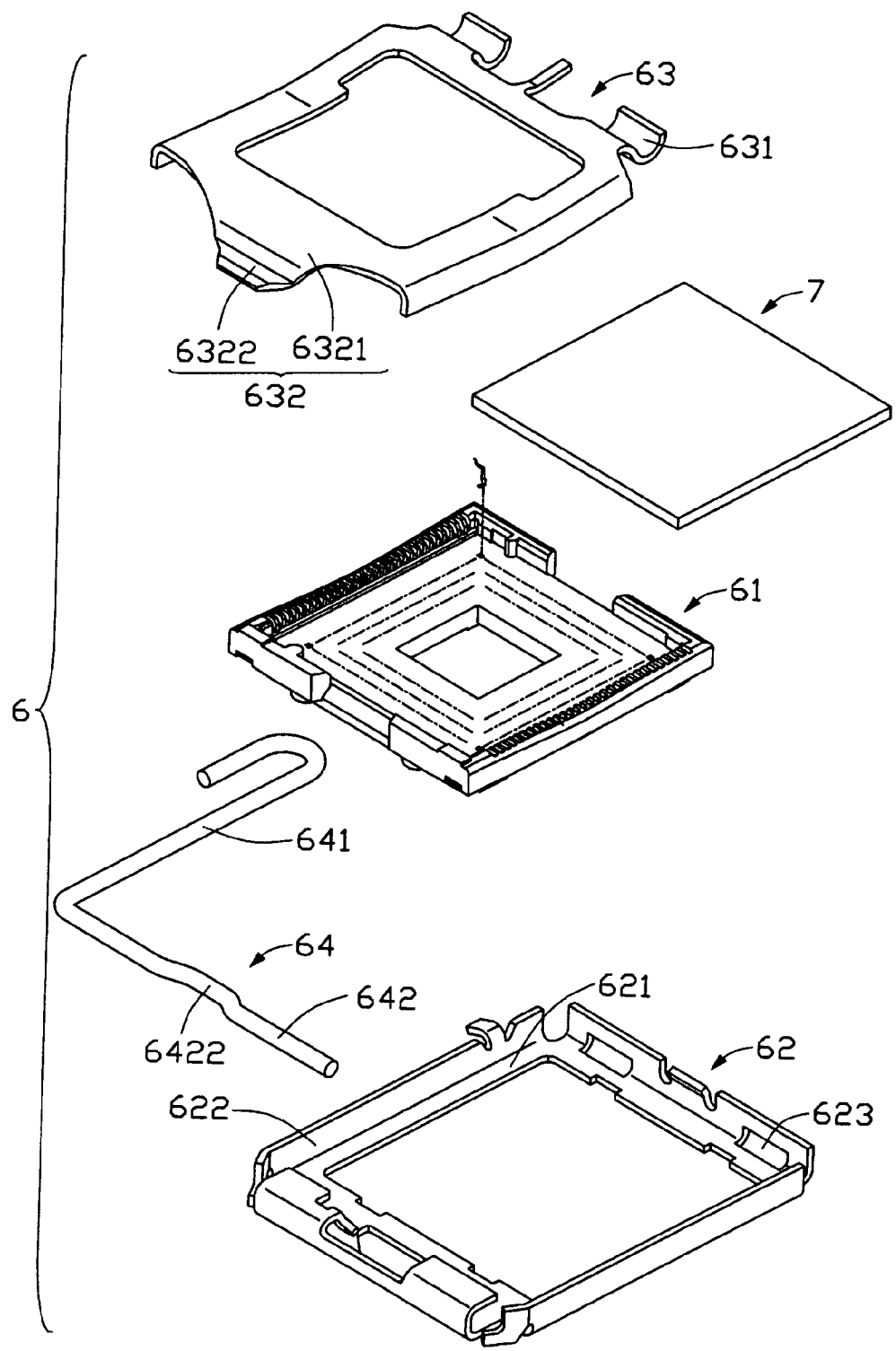
FIG. 4 is an exploded, isometric view of a conventional land grid array connector, together with a land grid package ready to be mounted onto the base of the land grid array connector.
Figure 5:
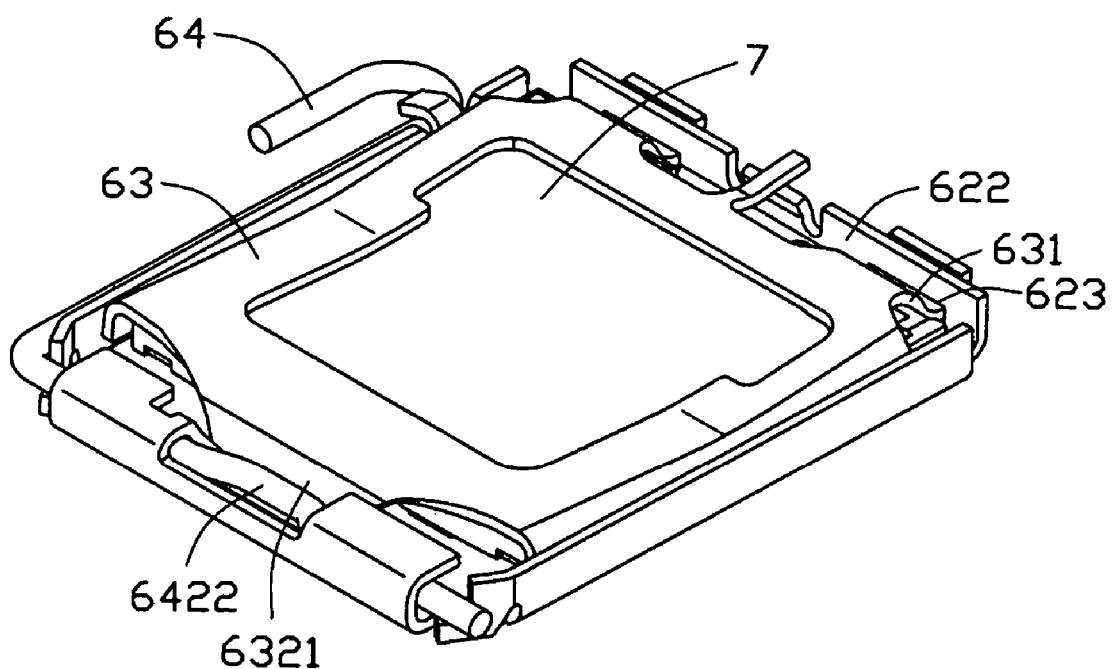
FIG. 5 is an assembled, isometric view of the land grid array connector of FIG. 4.

Referring to FIG. 3, a second embodiment of the land grid array connector is illustrated. The second embodiment has substantially the same configuration with the first embodiment. The difference is that the protrusion 422' of the clasp 42 extends from one lateral side of the first side surface of each U-shaped clasp 42. The lateral protrusions 422' abut against the side wall 32, and therefore stopping horizontal moving of the clip 4 during the lever 5 fastening the clip 4 onto the base 2.

In use of the connector 1, the LGP 8 is disposed onto the base 2. The clip 4 is then rotated downwardly to a horizontal closed position, and the protrusions 422, 422 of the clasp 42 abut against the side wall 32 of the stiffener 3. When the lever 5 is actuated to press the extending portion 44 of the clip 4, the pressing portion 522 engages with the transition portion 440 first and then moves to the pressed portion 523 little by little. During the moving process, the pressing portion 522 pushes the clip 4, and the extending portion 44 distorts. The pressing portion 522 eventually presses onto the pressed portion 442 of the clip 4, and the operation portion 51 is locked by the hook 340. Therefore, the LGP 8 is fastened between the clip 4 and the base 2.

Because the protrusions 422 abut against the side wall 32 of the stiffener 3, the lever 5 can not push the clip 4 to move in horizontal, and the LGP will not move with the clip 4 for the friction therebetween. Therefore, the LGP can be seated in the predetermined position, and reliable connecting performance is achieved.

While preferred embodiments in accordance with the present invention have been shown and described, equivalent modifications and changes known to persons skilled in the art according to the spirit of the present invention are considered within the scope of the present invention as defined in the appended claims.

What is claimed is:

1. A land grid array connector for interconnecting a land grid package and a circuit substrate, the land grid array connector comprising:
   a base defining a plurality of passageways for receiving a corresponding number of contacts therein;
   a stiffener defined around the base, the stiffener comprising a bottom plate and a plurality of side walls extending upwardly from the bottom plate, at least one side walls defining a plurality of slots;
   a clip having a plurality of clasps for pivotably engaging with the slots of stiffener;
   wherein each clasp defines at least one protrusion, the protrusion abuts against the side wall that defines slots for preventing the clip from moving horizontally.

2. The land grid array connector as claimed in claim 1, wherein the clasp is U-shaped, and the clasp comprises a first side surface connected with the clip and an opposite second side surface.

3. The land grid array connector as claimed in claim 2, wherein the protrusion protrudes from the first side surface into the U-shaped space of the clasp.

4. The land grid array connector as claimed in claim 2, wherein the protrusion extends from a lateral side of the first side surface.

5. The land grid array connector as claimed in claim 1, wherein a width of the clasp is slightly less than a width of the slot.

6. The land grid array connector as claimed in claim 5, wherein an anti-rotation bar is defined between the clasps.

7. A land grid array connector for electrically interconnecting a land grid package and a circuit substrate, the land grid array connector comprising:
   a base defining a plurality of passageways for receiving a corresponding number of contacts therein;
   a stiffener defined around the base, the stiffener comprising a bottom plate and a plurality of side walls extending upwardly from the bottom plate;
   a clip defining a plurality of clasps for pivotably engaging with the stiffener;
   wherein each clasp defines at least one protrusion abutting against a side wall of the stiffener for preventing the clip from moving horizontally.

8. The land grid array connector as claimed in claim 7, wherein at least the side wall of the stiffener abutting against the protrusions defines a plurality of slots for engaging with the clasps.

9. The land grid array connector as claimed in claim 8, wherein the clasp is U-shaped, and the clasp comprises a first side surface connected with the clip and an opposite second side surface.

10. The land grid array connector as claimed in claim 9, wherein the protrusion protrudes from the first side surface into the U-shaped space of the clasp.

11. The land grid array connector as claimed in claim 9, wherein the protrusion extends from a lateral side of the first side surface.

12. The land grid array connector as claimed in claim 7, wherein a width of the clasp is slightly less than a width of the slot.

13. The land grid array connector as claimed in claim 12, wherein an anti-rotation bar is defined between the clasps.

14. A land grid array connector for electrically interconnecting a land grid package and a circuit substrate, the land grid array connector comprising:
   a base defining a plurality of passageways for receiving a corresponding number of contacts therein;

a stiffener defined around the base, the stiffener comprising a bottom plate and a pair of opposite side walls extending upwardly from the bottom plate, a retaining slot formed in one of said side walls;

a clip defining at least a curved clasp at a pivotal end thereof for pivotably engaging within the retaining slot of the corresponding side wall of the stiffener;

a lever pivotally around the other of said side walls and engageable with a locking end of said clip which is opposite to said pivotal end so as to form a horizontal movement intention of said clip when said lever presses the locking end; and a protrusion formed on the curved clasp; wherein when the clip is in a horizontal position, the protrusion abuts against the corresponding side wall to prevent horizontal movement of the clip toward said corresponding side wall.

15. The connector as claimed in claim 14, wherein said protrusion essentially extends in a direction toward said corresponding side wall.

16. The connector as claimed in claim 14, wherein said protrusion essentially extends in a lateral direction parallel to said corresponding side wall.

* * * * *